United States Patent [19]
Sayiner et al.

[11] Patent Number: 5,910,969
[45] Date of Patent: Jun. 8, 1999

[54] METHOD OF DETECTING DC-FREE SEQUENCES

[75] Inventors: Necip Sayiner, Neshanic; Emina Soljanin, Summit, both of N.J.

[73] Assignee: Lucent Technologies Inc., Murray Hill, N.J.

[21] Appl. No.: 08/744,255

[22] Filed: Nov. 5, 1996

[51] Int. Cl.$^6$ .................................................. H03D 1/00
[52] U.S. Cl. ........................... 375/341; 371/43.1; 341/58
[58] Field of Search .............................. 341/58; 375/341, 375/340, 262, 263, 265; 371/43.1, 43.2, 43.4

[56] References Cited

U.S. PATENT DOCUMENTS

| | | |
|---|---|---|
| 4,888,779 | 12/1989 | Karabad . |
| 5,208,816 | 5/1993 | Seshadri . |
| 5,257,273 | 10/1993 | Fredrickson . |
| 5,398,073 | 3/1995 | Wei ......................................... 348/487 |
| 5,479,448 | 12/1995 | Seshadri . |
| 5,485,472 | 1/1996 | Fredrickson ............................... 371/43 |
| 5,497,384 | 3/1996 | Fredrickson et al. ...................... 371/43 |
| 5,608,397 | 3/1997 | Soljanin .................................... 341/58 |

OTHER PUBLICATIONS

J. W. Rae, G. S. Christiansen, P. Siegel, R. Karabad, H. Thapar and S. Shih, "Design and Parformance of a VLSI 120 Mb/s Trellis–Coded Partial Response Channel", *IEEE Transactions on Magnetic*, vol. 31, No. 2, Mar. 1995.

L. Frederickson, R. Karabed, J. W. Rae, P. H. Siegel, H. Thapar, and R. Wood, "Improved trellis coding for partial response channels," IEEE Trans. Magn., vol. 31, No. 2, pp. 1141–1148, Mar. 1995.

K. J. Knudson, J. K. Wolf and L. B. Milstein, "A concatenated decoding scheme for (l–D) partial response with matched spectral–null decoding", *Proc. 1993 IEEE Global Telecommun. Conf. (Globecom '93)*, Houston, TX, Nov. 1993, pp. 1960–1964.

G. Forney, Jr, "Multidimensional Constallations—Part I: Introduction, Figures of Merit, and Generalozed Cross Constellations", *IEEE Journal on Selected Areas in Communications*, vol. 7, No. 6, Aug. 1989.

A. R. Calderbank and N.J.A. Sloan "New Trellis Codes Based on Lattices and Cosets", *IEEE Transactions on Information Theory*, vol. IT–33, No. 2, Mar. 1987.

Tsie et al, "Concatenated Trellis–Coded 8–Ary PSK for Land Mobile Satellite Communications" ICC'92, pp. 0778–0782 1992.

G. Ferland, Modelling of a Trellis Decoder used as Inner Code in a concatenated coding system, CCECE/CCGEI pp. 259–26 1993.

Agazzi et al., Trellis–Based Postprocessing of Viterbi Decision for Noise Decorrelation and Compensation of Nonlinear Distorion, 1995 IEEE International Conference on Commuiniciations vol. 1, pp. 566–572, 1996.

Cherubini et al., "Concatenated Coding for Binary Partial–Response Channels", Proceeding of the ICC/Supercomm'94 vol. 3, p. 1789–94 1994.

*Primary Examiner*—Chi H. Pham
*Assistant Examiner*—Bryan Webster

[57] ABSTRACT

A method of decoding a sequence of samples received over a communications channel, such as a partial response channel, in which the sequence represents a length k binary bit stream encoded as a sequence of bipolar symbols comprised of q groups of L symbols, each length L group of said symbols corresponding to one of $2^m$ subwords having a predetermined block digital sum. The decoding method makes use of the structure of the encoding method by finding, in one illustrative embodiment, for each group of L samples, the maximum likelihood path through a time varying trellis supporting the sets of subwords having predetermined block digital sums to identify said subwords; recording the state metrics and branch metrics for each path and identifying, from the metrics the maximum likelihood path, the order of concatenation of the subwords.

11 Claims, 4 Drawing Sheets

METHOD OF DETECTING DC-FREE SEQUENCES

TECHNICAL FIELD

This invention relates to the coding of digital signal sequences which have predetermined energy spectra and, more particularly, to dc-free signals, i.e., signals having negligible energy spectra at zero frequency.

BACKGROUND OF THE INVENTION

A "channel" is the propagating medium or electromagnetic path connecting a transmitter and receiver and may be represented by a transmission line or, more generally, by any device characterized by a relevant alphabet of input signals i, output signals j, and a set of conditional probabilities $P(j|i)$ that describe the likelihood of receiving a signal j given that i was transmitted. It is useful to adopt the convention that the term binary refers to the alphabet $\{0,1\}$ while the term bipolar refers to the alphabet $\{-1, +1\}$. The bipolar version of a binary sequence will mean the sequence obtained by substituting +1 for the symbol 1 and −1 for the symbol 0. A conventional digital communication system utilizes a channel which gives rise to no intersymbol interference at time multiples of the symbol spacing interval, or which utlizes an equalizer to create this condition. When digital signals are transmitted over a channel at the Nyquist rate interference among the symbols occurs. When this is done in a controlled manner, the channel appears to have "memory" inasmuch as the received signal depends not only on the present symbol but also on a symbol that was transmitted one or two or N symbol intervals ago. The polynomial generally describing such a channel's transfer function may be expressed as $G(D)=1 \pm D \pm \ldots \pm D^N$, where D represents one signaling interval of delay.

Where the duration and repetition rate of the signals in relation to the channel bandwidth are such that the amount of interference between successive pulses is within certain limits, a multi-level form of signaling called partial response signaling results. Partial response signaling is used in a variety of applications, including magnetic recording, baseband repeaters for T-carrier, voice-channel modems and digital radio. Partial response signaling is of special interest over a partial response channel whose polynomial transfer function has a (1-D) factor exhibit a spectral null at zero frequency, i.e., the power density function of a channel sequence at zero frequency is zero and is a simple model for channels that cannot pass dc signals, e.g., those involving transformers. Among the dc-free channels used in magnetic recording systems are those characterized by the duobinary partial response (PR class 1) channel whose transfer polynomial is (1-D). The transfer polynomial (1-D) indicates that the channel has a "memory" of the immediately preceding digit. The modified duobinary (PR class 4) channel has a transfer polynomial of $(1-D^2)$, indicating that the channel has a "memory" of the symbol transmitted two time intervals ago. These two partial response channels may be characterized as being "dc-free". When successive bipolar symbols having magnitudes ±1 are applied to a channel having a (1-D) transfer function the result is signals having 3 amplitude levels, +2, 0 or −2.

If the sequences of signals applied to the dc-free partial response channel are encoded so that the codes are dc-free, a reduced probability of error in signal transmission is obtained. See, for example, R. Karabed and P. Siegel, "Matched Spectral Null Codes for the 1-D Partial-Response Channel", IEEE Trans. On Info. Theory, Vol, IT-37, No.3, May 1991, pp. 818–855 and U.S. Pat. No. 4,888,779 issued Dec. 19, 1989. The straightforward way of obtaining a dc-free code requires that each code have a block digital sum (BDS) of zero, which necessitates that each codeword have an even number of bits. While there are (n C n/2) dc-free output codewords that can be formed from a sequence of n bits, an input binary bit stream of k bits can select only k=floor $\log_2$ (n C n/2) of them, resulting in a maximum code rate of k/n. To obtain a higher code rate, a larger sequence must be used, requiring a larger "codebook". For example, a dc-free code employing a 14-bit output codeword would determine that k=floor $\log_2$ (14 C 7)=11, thereby limiting the code rate to 11/14 and requiring a codebook of $2^{11}$ words. A slightly higher code rate of 13/16 would require a block length of 16 bits and a codebook of $2^{13}$ words.

In the co-pending application of co-inventor Emina Soljanin, Ser. No. 08/515,445 filed Aug. 15, 1995, an encoding method is disclosed which produces a dc-free code using a smaller codebook than would be predicted by the above equations. This is accomplished, in part, by eliminating the restriction that channel codewords must all have a block digital sum (BDS) of zero and contain only an even number of bits. Instead, codewords are formed of sets of concatenated subwords each of which may have an arbitrary BDS so long as the overall digital sum of the subwords is zero. For example, sets of pairs of subwords having complementary block digital sum may be used or there may be "j" subwords each of BDS=−1 and one subword of BDS="+j", etc. In one illustrative code, pairs of bipolar subwords having the same BDS, but of complementary sign were concatenated in an order determined by a p-bit portion of the length k input sequence. The remaining (k-p) bits of the length k input sequence are divided into q groups of m bits. Each of the q groups selects (from a storage unit) one of $2^m$ bipolar length L subwords having a predetermined BDS. Since the m input bits are mapped to an output subword having L symbols, an "inner" rate m/L code is thereby defined. The number m is determined from floor $\log_2$ (L C n), where n is selected to provide a suitable number of dc-free combinations having a BDS=(L−2n). The overall code rate is, of course, established by the fact that k input bits produce qL output symbols, i.e, the rate is k/(qL), where k=p+qm.

Shown below is a table summarizing four of the illustrative codes. The columns are identified as follows: r is the code rate expressed as a fraction in which the numerator represents the number of input binary signals (identified as k in the second column), and the denominator represents the corresponding number of output symbols (represented by qL in the third column). q is the number of groups of m bits in the input and the number of groups of length L in the encoded output. The block digital sum of the subwords is indicated in the column BDS, while p/q identifies the outer code rate and m/L identifies the inner code rate. Note that in the rate 18/22 code there are pairs of subwords having block digital sums of ±1 as well as ±3. In the ensuing description of the present invention, reference will be made to the 46/56 code in the table below:

| r | k | qL | q | L | LCn | m | BDS | qm | p | p/q | m/L |
|---|---|----|---|---|-----|---|-----|----|---|-----|-----|
| 11/14 | 11 | 14 | 2 | 7 | 7C3 | 5 | 1 | 10 | 1 | 1/2 | 5/7 |
| 46/56 | 46 | 56 | 8 | 7 | 7C3 | 5 | 1 | 40 | 6 | 6/8 | 5/7 |
| 18/22 | 18 | 22 | 2 | 11 | 11C5 | 8 | 1 | 16 | 2 | 2/2 | 8/11 |
|  |  |  |  |  | 11C4 | 8 | 3 | " | " | " | " |

In the above-mentioned co-pending application, the disclosure of which is hereby incorporated by reference, a method of decoding the encoded qL sequence is disclosed which assumes a noiseless channel. When the individual bipolar symbols of amplitude +1, −1 are applied to a noiseless (1-D) channel the channel transfer function causes the received sequence qL to have readily apparent amplitudes of +2, 0 or −2, exactly. However, when the encoded sequence is received from a noisy channel, the signals received may no longer have values that are exactly +2 or −2. The correct values of the symbol sequence must then be detected from the noisy samples received from the channel. This is accomplished most efficiently by establishing the most probable values of each of the qL symbols, having in mind the permissible values allowed by the coding scheme. Once these values have been established decoding may take place as described in the aforementioned co-pending application.

The detection of codes on a (1- D) channel may be accomplished by employing such known prior art techniques as the time-varying trellis detection method disclosed by L. Fredrickson, R. Karabed, J. W. Rae, P. H. Siegel, H. Thapar, and R. Wood, "Improved trellis coding for partial response channels," IEEE Trans. Magn., vol. 31, no. 2, pp. 1141–48, March 1995 or by concatenated detection described by K. J. Knudson, J. K. Wolf and L. B. Milstein, "A concatenated decoding scheme for (1-D) partial response with matched spectral-null decoding", *Proc. 1993 IEEE Global Telecommun. Conf.* (*GLOBECOM '93*), Houston, Tex., November 1993, pp. 1960–1964. In this latter article it is proposed to treat the decoding process in two stages in which the first stage utilizes a maximum likelihood sequence estimation (MLSE) detector for the uncoded (1-D) channel to estimate the binary input sequence, ignoring the code. The second stage is an error-event detector which improves the estimate by using the dc-free block code to detect and correct minimum distance error events. Correction of minimum distance error events is made possible by the fact that minimum distance error events for the uncoded (1-D) channel have power at DC. Since the dc-free code has no power at dc, a minimum distance error event is detected whenever power at dc is observed. The error event detector used the dc-free block constraint to detect and correct minimum distance error events. The dc-free block constraint has the same properties as the dc-free code but includes some of the dc-free words not employed in the code.

While the above-referenced decoding methods of L. Fredrickson et al and Knudson et al will successfully decode the coded sequences of the above-mentioned co-pending application, these decoding methods do not make use of information about the encoding structure and must therefore attempt to decode the entire codeword as an entity. For example, the method of Knudson et al, which proceeds to estimate the entire codeword sequence (ignoring the code) provides resulting estimates which may not actually be codewords, i.e., may not be dc-free codewords. The Knudson et al method computes the BDS for each estimated codeword and, upon detecting a codeword having a non-zero BDS, modifies the estimate by the most likely minimum distance error event so that the result will be a word with zero BDS. The complexity of the postprocessing lies in its search for the most likely minimum distance error event. Similar considerations affect the use of the Fredrickson et al time varying trellis detection.

SUMMARY OF THE INVENTION

In accordance with the principles of the present invention, the detection of a symbol sequence from the samples received over a noisy channel makes use of the structure according to which the symbols were originally encoded, namely, the encoding method employed in the above-mentioned co-pending application. That encoding method produced a dc-free, bipolar code having an overall rate of k/(qL) by mapping a length k binary input sequence into an output sequence of q pairs of bipolar subwords of length L (i.e., each subword was composed of L bipolar symbols).

As stated above, the decoding method of the present invention utilizes the fact that the codewords appearing on the channel are composed of subwords whose overall BDS=0 which, illustratively, may include sets of subwords of complementary block digital sum (e.g., sets of pairs of subwords having complementary BDS=+x, −x, +y, −y, etc., or even j subwords of BDS=+x and one subword of BDS=−jx) that are selected by an inner rate m/L code while the order of the subwords is determined by an outer rate p/q code. Detection of codewords is accomplished by a detector for the inner code which finds the maximum likelihood paths through an "inner" trellis for each block digital sum transmitted over the channel, i.e., the inner trellis is constructed with the knowledge of the encoding method. For example, if the subwords are selected from sets of pairs of subwords having complementary BDS=+x, −x, +y, −y, there will be maximum likelihood paths through inner trellises for each of these block digital sums. The cumulative branch metrics $m^1_{+x}$, $m^1_{-x}$, $m^1_{+y}$, $m^1_{-y}$, etc., for each of the maximum likelihood paths are determined and stored in a path memory. This procedure is repeated q times and, when all qL data samples have been received and processed by the inner detector, the most likely path through an outer trellis which describes the order in which the subwords have been concatenated is found using the information from the updated path memory. Advantageously, where the encoding method uses paired sets of subwords having complementary block digital sums, the outer trellis may be dispensed with merely by calculating the difference between the cumulative metrics for the two maximum likelihood paths until the differences for all q groups have been found. The smallest difference metrics identify which subwords of the pairs need to be inverted thereby determining the order of concatentation.

DESCRIPTION OF THE DRAWING

The foregoing and other objects and features of the present invention may become more apparent when the ensuing description is read together with the drawing in which.

GENERAL DESCRIPTION

Figures 1, 2:
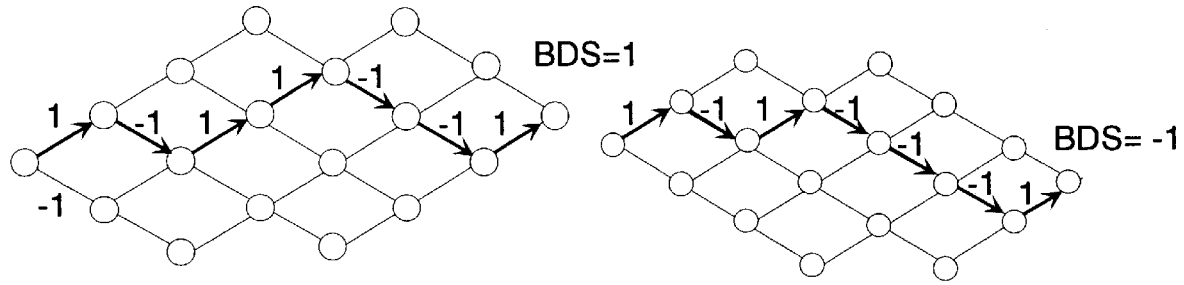
FIG. 1 is a trellis diagram showing all of the permissible transitions for a 7-bit subword which accumulates a net BDS of +1.
FIG. 2 is a trellis diagram showing all of the permissible transitions for a 7-bit subword which accumulates a net BDS of −1.

FIG. 1 shows the trellis for sequences of 7 bipolar symbols that can form a block digital sum (BDS) of +1. Each upward pointing arrow represents a positive bipolar symbol and each downward pointing arrow represents a negative bipolar symbol. An illustrative sequence +1, −1, +1, +1, −1, −1, +1 is shown heavier. Since this sequence has 4 symbols=+1 and 3 symbols=−1 its BDS=+1. Every other sequence which can be raced through the trellis from the left-most node to the right-most node will also have a BDS=+1. FIG. 2 shows a trellis for a sequence of 7 bipolar symbols that can form a BDS=−1. An illustrative sequence +1, −1, +1, −1, −1, −1, +1 is shown heavier. Since this sequence has 4 symbols=−1 and 3 symbols=+1, its BDS=−1. Every other sequence which can be traced through this trellis will have a BDS=−1.

Figure 3:
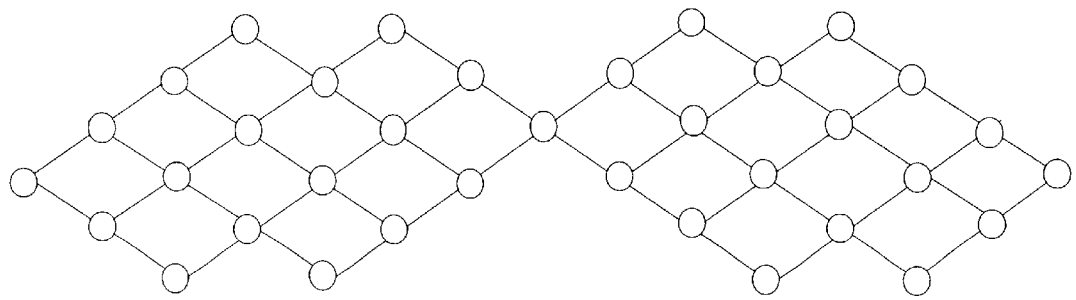
FIG. 3 is a trellis comprised of the trellises of FIGS. 1 and 2 taken in one order of concatenation.
Figure 4:
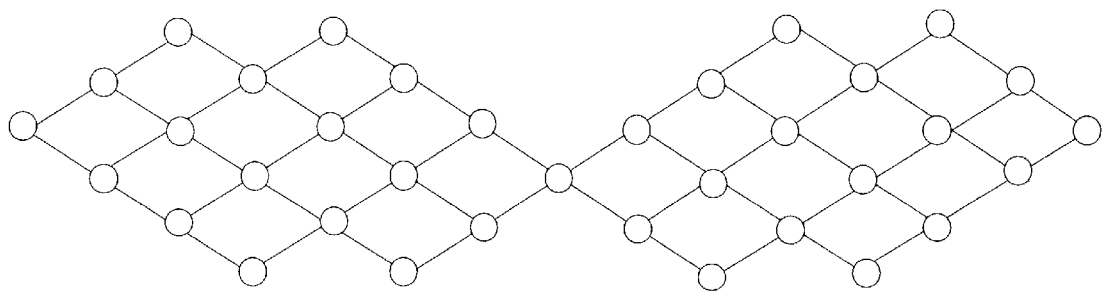
FIG. 4 is a trellis comprised of the trellises of FIGS. 1 and 2 taken in the reverse order of concatenation.
Figure 5:
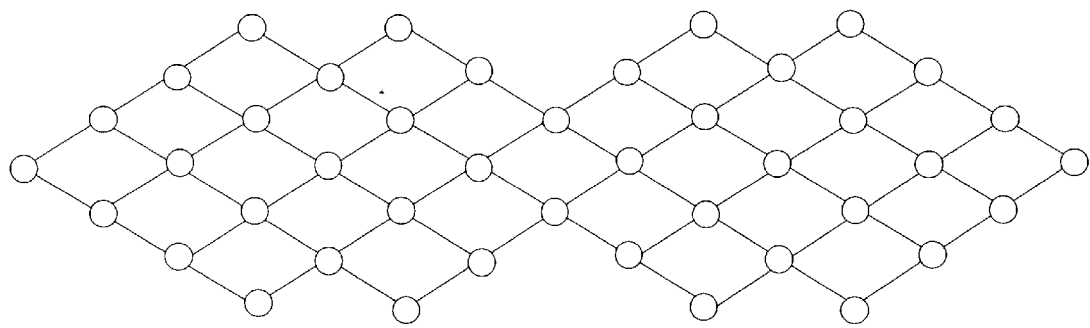
FIG. 5 is the union trellis comprised of the trellises of FIGS. 3 and 4, as seen by a prior art detector.

The trellises of FIGS. 1 and 2 can be combined ("concatenated") in two different orders. FIG. 3 shows a trellis consisting of the trellises of FIGS. 1 and 2 to form concatenated subwords of BDS=+1 and −1 whereas FIG. 4 shows a trellis consisting of the trellises of FIGS. 1 and 2 concatenated to form subwords of BDS=−1 and +1. Since the prior art detector methods made no use of the encoding structure, they could not tell whether subwords were concatenated in the order of FIG. 3 or in the order of FIG. 4. Such prior art methods therefore had to decode the union trellis, shown in FIG. 5, which is composed of the trellises of FIGS. 3 and 4 in either order.

It will be advantageous to describe the method of this invention for detecting the individual symbols of the qL encoded sequence by using subwords having an illustrative length L=7. An illustrative rate 46/56 code, set forth in the table above, will be employed. The rate 46/56 code was constructed by dividing the k=46 bit information input sequence into a group of p=6 bits and m=5 groups of q=8 bits. The length qL=56 channel sequence is formed from q=8 groups of length L=7 bipolar subwords having BDSs of +1 or −1. Each length m=5 group of the input sequence selects (from a memory unit) one of the length L=7 bipolar subwords having a BDS=+1 (or −1). The encoding procedure concatenates the subwords of FIGS. 1 and 2 so that q sets of them have an overall BDS=0 but whose information content depends on the order in which the subwords are assembled. As mentioned, the order of concatenation is determined by the p bit sequence of input bits.

It will be recalled that the rate 46/56 encoder was constructed by means of a outer rate p/q=6/8 code and an inner rate m/L=5/7 code and that the length qL=56 dc-free sequence is composed of q=8 length L=7 subwords. Every length L=7 subword corresponds to a path through one of the two trellises of FIGS. 1 and 2 and therefore to a path through the union trellis of FIG. 6. This trellis describes the inner rate m/L=5/7 code and will be referred to as the inner trellis. The trellis for the outer rate p/q code, in which each symbol denotes the BDS of the associated subword, corresponds to a path through the outer trellis of FIG. 7. Because of the transfer function of the (1-D) channel, the bipolar symbols of the subwords that were applied to the channel with original magnitudes of ±1 will, ideally, be received as bipolar signals having 3 amplitude levels, +2, 0 or −2. However, because the channel will be assumed to introduce Gaussian noise, the amplitudes as received will likely be different. In accordance with this embodiment, the inner detector reconstructs the (two) maximum likelihood paths of length L (=7) through the inner trellis of FIG. 6, one with BDS=+x (=1) and one with BDS=−x (=−1).

Figure 6:
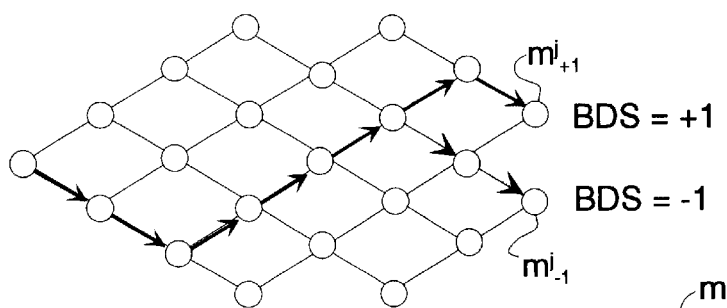
FIG. 6 is an illustrative union trellis comprised of the superimposition of the trellises of FIGS. 1 and 2 and which describes the inner code m/L.
Figure 7:
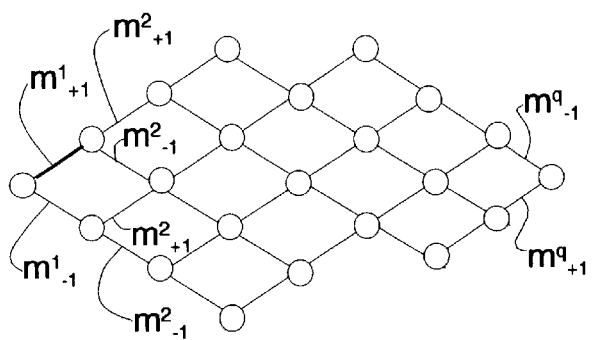
FIG. 7 is an illustrative trellis of the outer rate p/q code which describes the BDS of associated subwords.

The identities of the first two paths which have been found after the first of the q (=8) sets of L (=7) received samples have been processed by FIG. 6 are stored, and their cumulative metrics, $m^1_{+1}$ and $m^1_{-1}$, are passed to FIG. 7, which is the detector for the outer trellis. The detector of FIG. 7 uses each set of cumulative metrics received from the inner trellis to delineate corresponding branches of its trellis. Stated otherwise, the cumulative metrics of FIG. 6 become the branch metrics of FIG. 7. For example, the cumulative branch metrics $m^1_{+1}$ and $m^1_{-1}$ from the first set of L samples from FIG. 6 establish the branches $m^1_{+1}$ and $m^1_{-1}$ in FIG. 7. As each group of L samples is processed in FIG. 6, the cumulative branch metrics produced are $m^j_{+1}$, $m^j_{-1}$ where 1<j<q, the superscript j indicating to which of the q groups of L samples the metric pertains. When the cumulative branch metrics for all q (=8) groups of L samples have had been passed to FIG. 7 the final branches of its paths having metrics $m^q_{-1}$ and $m^q_{+1}$ are defined. Note that the outer code p/q is dc-free so that all possible paths through FIG. 7 have BDS=0.

Figure 8:
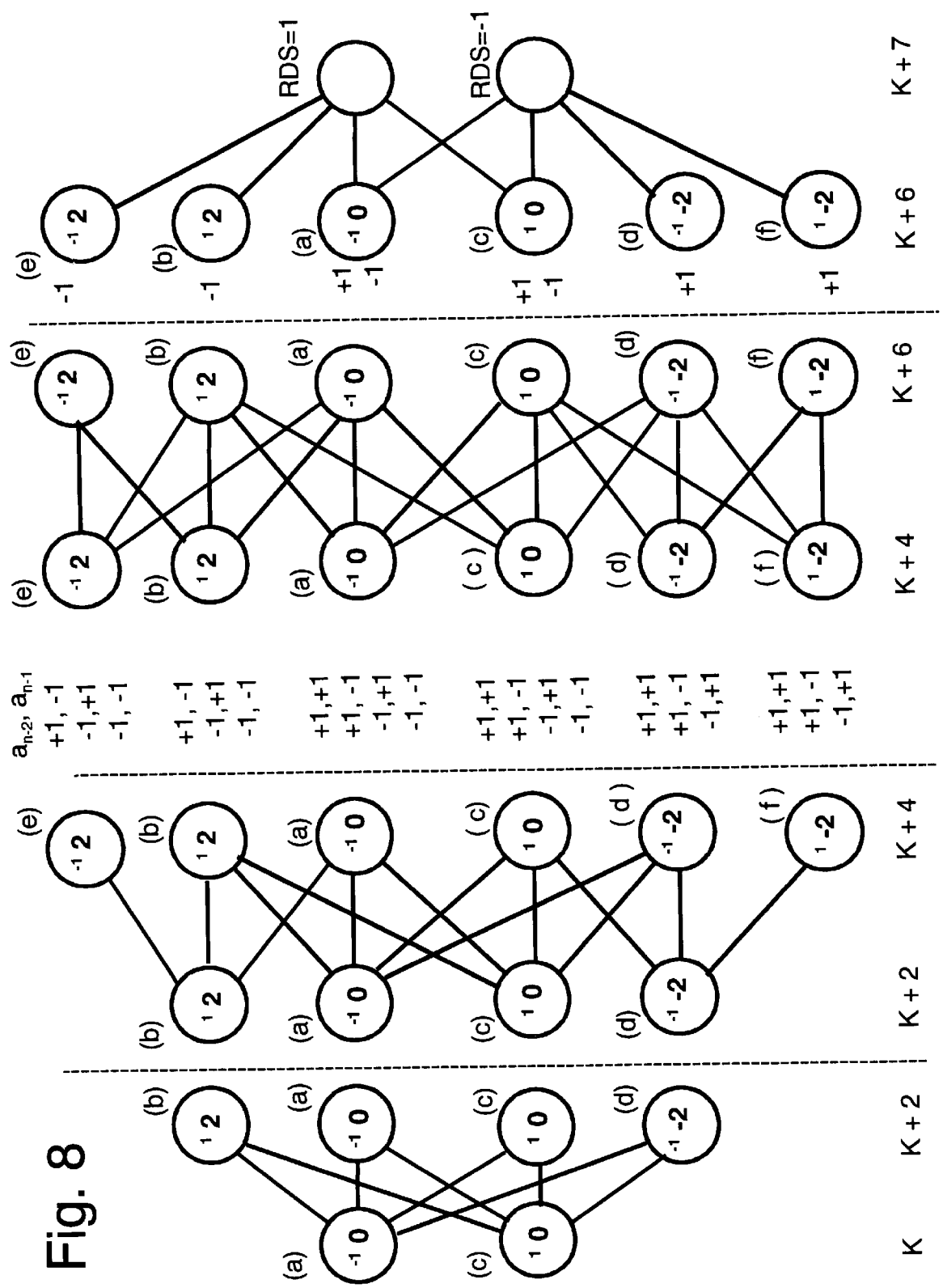
FIG. 8 is a time varying trellis for the inner rate m/L code which repetitively detects the maximum likelihood sequence of symbols in the encoded samples of length qL.
Figure 9:
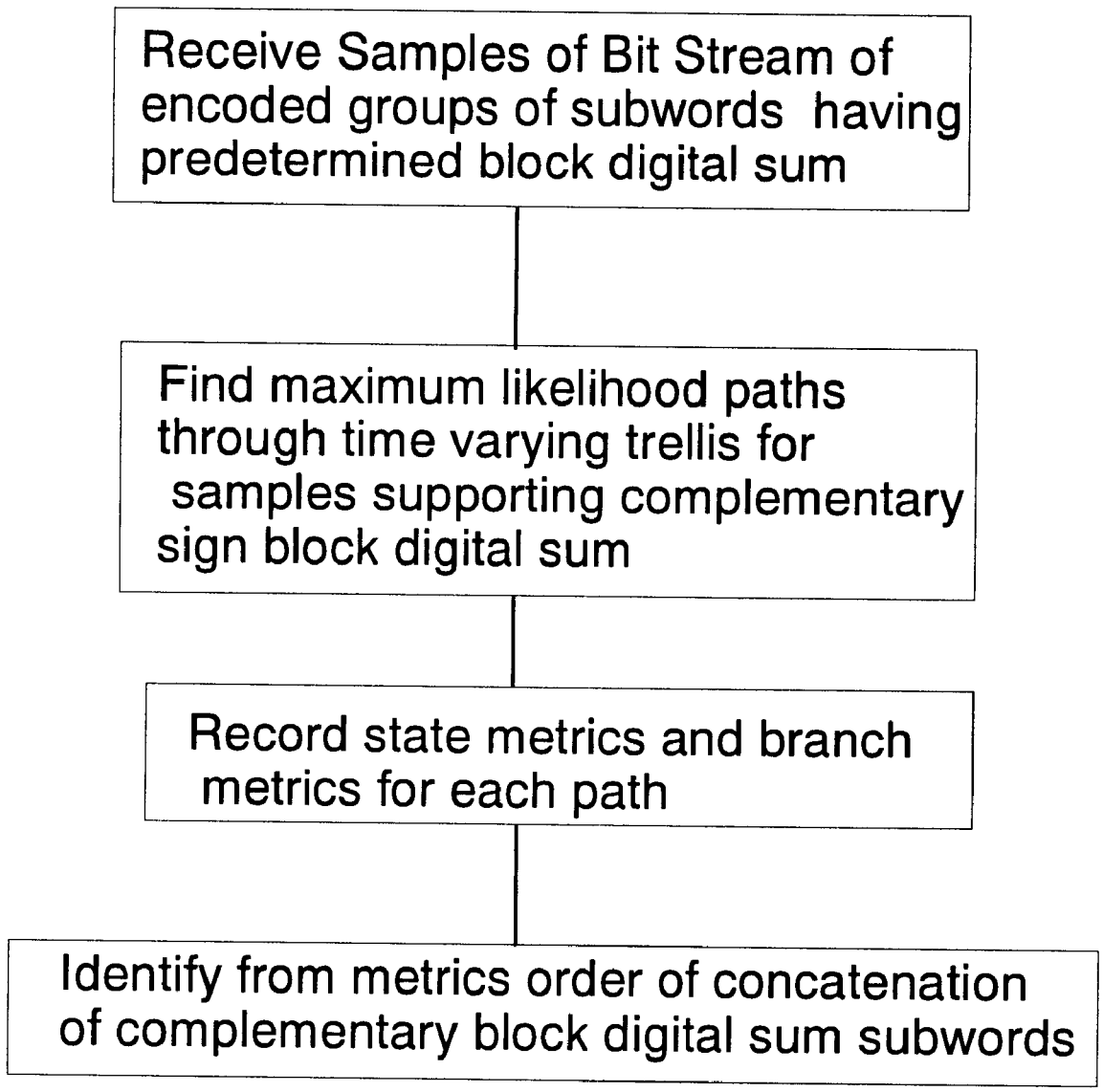
FIG. 9 is a flow chart of FIGS. 6 and 7.

Referring to FIG. 8 there is shown an illustrative, time-varying trellis for decoding the inner rate m/L (=5/7) code referred-to above. For the sake of simplicity, the trellis has been shown as consisting of four distinct panels. However, each of the panels is a subset of the generic third panel so that it is reconfigurable to form each of the other individual panels shown. The first two samples received over the channel are submitted to the detector configured as the left-most panel at times K+1 and K+2. The next two samples are submitted to the detector configured as the second panel at times K+3 and K+4. The fifth and sixth samples are delivered to the detector configured as the third panel at times K+5 and K+6 and the last sample of the seven sample sequence is delivered to the detector configured as the right-most panel at time K+7. The trellis of FIG. 8 can assume six possible states, indicated by the horizontal rows of nodes which are labeled, in order from top to bottom, (e), (b), (a), (c), (d), and (f). Each panel performs the Viterbi algorithm on the samples delivered to it. The Viterbi algorithm calculates, for each branch path merging at a particular node in a panel, the log-likelihood probability that the received sequence travels that particular branch path. This probability is known as the "metric" for the branch path. The metric is a real number which is determined by the square of the difference between the expected symbol's nominal amplitude (e.g., +2, 0, or −2) and the actual amplitude $r_K$ of the received sample. For example, the metric m for a branch path where the expected nominal amplitudes of the symbols at times K and K+1 would be 0 and −2 but the actual amplitudes are $r_k$ and $r_{K+1}$ may be expressed as $m=(r_K-0)^2+(r_{K+1}-(-2))^2$. The branch metrics of all branches merging at a particular node are compared with each other and that path is allowed to "survive" which has the smallest cumulative metric.

Consider again the two left-most nodes (a) and (c) of the left-most panel. At the outset, the running digital sum of the present block is initialized to 0. However, because the present block will, in general, have been preceded by a block whose running digital sum was, according to the encoding constraint, either +1 or −1, the superscript −1 in node (a) indicates that the previous block had a running digital sum of −1 while node (c) is labeled with the superscript +1 to indicate that the previous block had a running digital sum of +1. The ensuing description will assume that the previous block had a running digital sum of −1 and so we begin at node (a).

At the end of the second time slot, K+2 the left-most panel may exhibit one of our possible states, identified by the nodes labeled at the right, from top to bottom, (b), (a), (c) and (d). The trellis can be in the state at node (b) having traveled the branch from node (a) or from node (c). Both branches would respond to the same received sequence +1, +1 and would thus have the same metric. Since the branch metrics are the same, the branch that comes from the state which has the lower state metric is chosen as the "survivor". Similar considerations apply for the trellis being in state (a) at the right having traveled via the branch from node (a) or from node (c) in response to the same received sequence +1, −1; or being in state in state (c) having traveled via the branch from node (a) or from node (c) in response to the same received sequence −1,+1; or being is state (d) at the right having traveled the branch from node (a) or from node (c) in response to the same received sequence −1,−1. In general, however, the suriving branch entering a node at the right is determined by selecting that branch which has the lowest sum of its branch metric and the state metric of the node from which it came.

The second panel receives the third and fourth samples and, in response, any of the six nodes at its right-hand side may be reached. The four nodes (b), (a), (c) and (d) at the left of the second panel correspond to the four nodes (b), (a), (c), (d) at the right of the first panel. Transitions from the nodes (b), (a), (c), (d) at the left of the second panel to similarly labeled nodes at the right of this panel are produced by signal sequences corresponding to the signal sequences described for the first panel. In addition, the transition from node (b) at the left to node (e) at right is produced by the sequence +1, −1; the transition from node (b) to node (a) is produced by the sequence −1, −1; the transition from node (d) at the left to node (c) at the right is produced by the sequence +1, +1; the transition from node (d) to node (f) is produced by the sequence −1, +1. Note that the encoding constraint does not allow a transition from node (b), (RDS=2) to node (c), (RDS=0, last symbol +1) since a 7-symbol code which is to achieve a block digital sum of +1 or −1 cannot reduce the running digital sum to 0 from a running digital sum of 2 within two symbols when the last symbol received is +1.

The fifth and sixth samples are delivered to the third panel and, as before, transitions between similarly labeled nodes in this panel are produced by the corresponding symbol sequences previously described. The seventh sample of the present block is delivered to the right-most panel. From nodes (e) or (b) at the top left of this panel, where the running digital sum is 2, only a symbol having the value −1 can lead to the right-most node RDS=1. From node (a) of this panel, where the running digital sum is 0, a symbol having the value +1 will lead to the right-most node RDS=1 while a symbol having the value −1 will lead to the right-most node RDS=−1. Likewise, from the left-most node (c) of this panel, where the running digital sum is 0, a symbol having the value +1 will lead to the right-most node RDS=1, while a symbol having the value −1 will lead to the right-most node RDS=−1. From nodes (d) or (f) at the bottom left of this panel, where the running digital sum is −2, only a symbol having the value +1 can lead to the right-most node RDS=1.

What has been described is deemed to be illustrative of the principles of the invention, however, numerous alterations may made, as will be apparent to those skilled in the art. For example, provided that the subwords are encoded in pairs having complementary block digital sums, the trellis for the outer matrix may be eliminated by computing the eight differences between the two cumulative branch metrics found by the detector for the inner trellis of FIG. 6. The four smallest metrics identify the positions of the subwords which are to be inverted. That is, the outer trellis serves to describe the outer code of length 8 bipolar words each having four +1s and four −1s in which the positions of the 1s identify which of the subwords are to be inverted. Accordingly, instead of storing the two state metrics produced by the inner trellis, it is enough to calculate the difference of the two metrics. After the 56 samples have been received there will be 8 difference metrics, one for each of the 8 groups of 7 bit sequences. The four smallest differences correspond to the positions of the +1s and the others correspond to the positions of the −1s, where the positions of the −1s indicate which 7 bit sequences are to be inverted. Additionally, it is to be appreciated that the principles of the invention are applicable to sequences transmitted over communications channels whose transfer polynomial is $(1-D)^N$ by employing multiple versions of FIG. 8 and applying successive signals to the respective versions. Further and other modifications will be apparent to those skilled in the art without however departing from the spirit and scope of the invention.

What is claimed is:

1. A method of decoding a sequence of samples received over a communications channel representing a length k binary bit stream encoded as a sequence of bipolar symbols comprised of q groups of L symbols, each length L group of said symbols corresponding to one of $2^m$ subwords having a predetermined block digital sum, said subwords having been encoded according to an inner rate m/L code and concatenated into blocks of complementary sign block digital sum according to an outer rate p/q code, where p is one part of said length k sequence and qm is the remaining part, comprising the steps of:

a. finding, for each group of L samples, the maximum likelihood paths through a trellis of said inner rate p/q code for said subwords having complementary sign block digital sums of +q and of −q;

b. recording the cumulative state metrics and cumulative branch metrics for each of said paths; and c. identifying from said cumulative metrics for each said group of L samples a corresponding branch in a trellis for said outer rate m/L code to determine the order of concatenation of said subwords.

2. A method of decoding a sequence of samples according to claim 1 wherein said communcations channel is a partial response channel.

3. A method of decoding a sequence of samples according to claim 2 wherein said communcations channel is a partial response channel whose polynomial transfer function has a (1-D) factor.

4. A method of decoding a sequence of samples according to claim 3 wherein said trellis for said inner rate code is a time-varying trellis.

5. A method of detecting a sequence of samples according to claim 1 wherein the number m is determined from floor $\log_2$ (L C n), where n is selected to provide a number of dc-free combinations having a BDS=(L−2n).

6. A method of decoding a sequence of samples received over a communications channel, said sequence representing a length k binary bit stream encoded as a sequence of bipolar symbols comprised of q groups of L symbols, each length L group of said symbols corresponding to one of $2^m$ subwords having a predetermined block digital sum, said subwords having been encoded according to an inner rate m/L code and concatenated into blocks of complementary sign block digital sum according to an outer rate p/q code, where p is one part of said length k sequence and qm is the remaining part, comprising the steps of:

a. finding, for each group of L samples, the maximum likelihood path through a trellis of said inner rate p/q code for each of a set of subwords having complementary block digital sums;

b. recording the cumulative state and branch metrics for each said path until the maximum likelihood paths for q groups of L samples have been found;

c. recording the difference between the branch metrics for each said path; and d. determining the order of concatenation of said subwords according to the q/2 smallest ones of said metrics.

7. A method of detecting a sequence of samples according to claim 6 wherein the number m is determined from floor $\log_2$ (L C n), where n is selected to provide a number of dc-free combinations having a BDS=(L−2n).

8. A method of detecting a sequence of samples received over a partial response channel in the presence of noise, said sequence representing a length k binary bit stream encoded as a sequence of bipolar symbols comprised of q groups of L symbols, each length L group of said symbols corresponding to one of $2^m$ subwords having a predetermined block digital sum, said subwords having been encoded according to an inner rate m/L code and concatenated into blocks of complementary sign block digital sum according to an outer rate p/q code, where p is one part of said length k sequence and qm is the remaining part, comprising the steps of:

a. distributing each successive group of L samples of signals received over said channel to a respective panel of a trellis supporting said complementary block digital sum subwords of said inner rate code;

b. finding the maximum likelihood path through each said panel for each of said complementary sign block digital sum subwords in said group of L samples;

c. tabulating the cumulative branch and state metrics through said panels respective to each said path; and d. identifying from of said cumulative metrics a branch through a trellis supporting said outer rate m/L code to determine the order of concatenation of said subwords.

9. A method of detecting a sequence of samples according to claim 8 wherein the number m is determined from floor $\log_2$ (L C n), where n is selected to provide a number of dc-free combinations having a BDS=(L−2n).

10. A method of detecting a sequence of samples received over a communications channel in the presence of noise, said sequence representing a length k binary bit stream encoded as a sequence of bipolar symbols comprised of q groups of L symbols, each length L group of said symbols corresponding to one of $2^m$ subwords having a predetermined block digital sum, said subwords having been encoded according to an inner rate m/L code and concatenated into blocks of complementary sign block digital sum according to an outer rate p/q code, where p is one part of said length k sequence and qm is the remaining part, comprising the steps of:

a. distributing each successive group of L samples of signals received over said channel to a respective panel of a time-varying trellis supporting said complementary block digital sum subwords;

b. finding the maximum likelihood paths for said complementary block digital sum subwords through each said panel for each said group of L samples;

c. recording the state metrics and branch metrics for each said of said paths;

d. recording the difference between the metrics for said paths; and e. determining the order of concatenation of said subwords according to the q/2 smallest ones of said metrics.

11. A method of detecting a sequence of samples according to claim 10 wherein the number m is determined from floor $\log_2$ (L C n), where n is selected to provide a number of dc-free combinations having a BDS=(L−2n).

\* \* \* \* \*